United States Patent
Kula et al.

(10) Patent No.: US 7,007,373 B2
(45) Date of Patent: Mar. 7, 2006

(54) METHOD OF MANUFACTURING ENHANCED SPIN-VALVE SENSOR WITH ENGINEERED OVERLAYER

(75) Inventors: Witold Kula, Cupertino, CA (US); Alexander M. Zeltser, San Jose, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 62 days.

(21) Appl. No.: 10/298,340

(22) Filed: Nov. 18, 2002

(65) Prior Publication Data

US 2004/0095692 A1    May 20, 2004

(51) Int. Cl.
   G11B 5/187     (2006.01)
   C23C 14/06     (2006.01)
   B05D 5/12      (2006.01)

(52) U.S. Cl. .............. 29/603.14; 29/603.13; 360/324; 360/324.11; 360/324.12; 204/192.11; 204/192.2; 427/130; 427/255.28

(58) Field of Classification Search .......... 29/603.14, 29/603.13, 603.07; 360/324, 324.11, 324.12, 360/328; 204/192.11, 192.2; 427/128, 130, 427/126.1, 255.28
See application file for complete search history.

(56) References Cited

U.S. PATENT DOCUMENTS

| | | | |
|---|---|---|---|
| 4,267,207 A * | 5/1981 | Sasazawa et al. ....... 427/130 X |
| 5,747,859 A | 5/1998 | Mizushima et al. ........ 257/421 |
| 5,973,334 A | 10/1999 | Mizushima et al. .......... 257/25 |
| 6,033,532 A * | 3/2000 | Minami ................. 204/192.11 |
| 6,108,177 A | 8/2000 | Gill ........................ 360/324.12 |
| 6,201,671 B1 | 3/2001 | Pinarbasi ............... 360/324.11 |
| 6,268,985 B1 * | 7/2001 | Pinarbasi ............... 360/324.12 |
| 6,296,741 B1 | 10/2001 | Pinarbasi ............... 204/192.11 |
| 6,621,667 B1 * | 9/2003 | He et al. ................ 360/324.12 |
| 2001/0040774 A1 | 11/2001 | Funada et al. ............. 360/314 |

FOREIGN PATENT DOCUMENTS

JP    2002-150517    * 5/2002

OTHER PUBLICATIONS

Sakakima et al, "Enhanced GMR in PtMn-based Spin Valves with Specular Reflective Thin Oxide Layers", IEEE Transactions o Magnetics, vol. 36, Issue 5, pp. 2554-2556, Sep. 2000.*

* cited by examiner

Primary Examiner—A. Dexter Tugbang
(74) Attorney, Agent, or Firm—Walter W. Duft

(57) ABSTRACT

A method for making an enhanced spin valve sensor with engineered overlayer for sensing magnetically recorded information on a data storage medium. The method includes forming a ferromagnetic free layer and a ferromagnetic pinned layer sandwiching an electrically conductive spacer layer. An overlayer is formed on the free layer and adapted to decrease free layer magnetic thickness without reducing physical thickness.

10 Claims, 7 Drawing Sheets

METHOD OF MANUFACTURING ENHANCED SPIN-VALVE SENSOR WITH ENGINEERED OVERLAYER

BACKGROUND OF THE INVENTION

1. Field of the Invention

The present invention relates to magnetoresistive sensors for reading magnetically recorded information from data storage media, and particularly to spin valve read sensors for direct access storage device (DASD) systems.

2. Description of the Prior Art

By way of background, spin valve sensors, also known as giant magnetoresistive (GMR) sensors, are commonly used in read heads for magnetic media-based DASD systems, such as disk drives. A spin valve sensor is a magneto-electrical device that produces a variable voltage output in response to magnetic field fluctuations on an adjacent magnetic storage medium. As illustrated in FIG. 1, a conventional spin valve device is formed by first and second ferromagnetic layers, hereinafter referred to as a "pinned" layer and a "free" layer, separated by an electrically conductive spacer layer. In a disk drive, these layers are oriented so that one edge of the layer stack faces an adjacent disk surface, in a cross-track direction, and so that the layer planes of the stack are perpendicular to the disk surface. The magnetic moment ($M_1$) of the pinned layer is oriented at an angle $\theta_1$ that is perpendicular to the disk surface (i.e., $\theta_1=90°$). It is sometimes referred to as the "transverse" magnetic moment of the sensor. The magnetic moment $M_1$ is substantially pinned so that it will not rotate under the influence of the disk's magnetic domains. Pinning is typically achieved by way of exchange coupling using an adjacent antiferromagnetic pinning layer. The magnetic moment ($M_2$) of the free layer has a zero bias point orientation $\theta_2$ that is parallel to the disk surface (i.e., $\theta_2=0°$). It is sometimes referred to as the "longitudinal" magnetic moment of the sensor. The magnetic moment $M_2$ is free to rotate in positive and negative directions relative to the zero bias point position when influenced by positive and negative magnetic domains recorded on the disk surface. In a digital recording scheme, the positive and negative magnetic domains correspond to digital "1s" and "0s." The zero bias point is the position of the free layer magnetic moment $M_2$ when the sensor is in a quiescent state and no external magnetic fields are present.

Electrical leads are positioned to make electrical contact with the pinned, free and spacer layers. In a CIP (Current-In-Plane) spin valve sensor, as shown in FIG. 1, the leads are arranged so that electrical current passes through the sensor stack in a cross-track direction parallel to the layer planes of the stack. When a sense current is applied by the leads, a readback signal is generated in the drive processing circuitry which is a function of the resistance changes that result when the free layer magnetic moment $M_2$ rotates relative to the pinned layer magnetic moment $M_1$ under the influence of the recorded magnetic domains. These resistance changes are due to increases/decreases in the spin-dependent scattering of electrons at the interfaces of the spacer layer and the free and pinned layers as the free layer's magnetic moment $M_2$ rotates relative to the magnetic moment $M_1$ of the pinned layer. Resistance is lowest when the free and pinned layer magnetic moments are parallel to each other (i.e., $\theta_2=90°$) and highest when the magnetic moments are antiparallel (i.e., $\theta_2=-90°$). The applicable relationship is as follows:

$\Delta R \propto \cos(\theta_1-\theta_2) \propto \sin \theta_2$. The $\Delta R$ resistance changes cause potential differences that are processed as read signals.

It is important that a spin valve sensor exhibits high GMR effect ratio (i.e., a high ratio of change in resistance to the resistance of the sensor as a function of an applied magnetic field) in order to provide maximum sensitivity. It is likewise desirable to construct the free layer so that it exhibits controlled negative magnetostriction for high stability.

As the areal density in magnetic recording increases, it is necessary to reduce the magnetic thickness of both the recording medium and the free layer of the sensor. The magnetic thickness of a material is given by the product of the remanent magnetic moment density (Mr) and physical thickness (t) of the material, and is commonly expressed as Mr*t. The conventional approach to decreasing the free layer magnetic thickness in a spin valve sensor is to decrease the free layer's physical thickness, e.g., from 30 Å to 25 Å or below. Unfortunately, reducing the free layer's physical thickness tends to decrease sensor sensitivity by reducing its GMR ratio and causing free layer magnetostriction to become more positive.

One approach to improving the performance of spin valve sensors with thin free layers is a "spin filter" design, in which a thin layer of highly electrically conductive and non-magnetic material, typically copper (Cu), is inserted between the sensor free layer and its (preferably oxide) cap layer. With this design, however, the spin valve sheet resistance undesirably decreases.

Accordingly, a need exists for a GMR sensor configuration wherein decreased free layer magnetic thickness is achieved in order to accommodate increased areal data densities while maintaining high sensor GMR ratio and controlled negative magnetostriction in the free layer. What is required in particular is a GMR sensor having a free layer with decreased magnetic thickness and improved sensitivity without having to decrease free layer physical thickness and thereby negatively impact sensor GMR ratio and free layer magnetostriction.

SUMMARY OF THE INVENTION

The foregoing problems are solved and an advance in the art is obtained by a novel GMR sensor for sensing magnetically recorded information on a data storage medium, together with fabrication methods therefor. The sensor includes a ferromagnetic free layer and a ferromagnetic pinned layer sandwiching an electrically conductive spacer layer. An engineered overlayer is formed on the free layer to decrease free layer magnetic thickness without reducing physical thickness, which allows high sensor GMR ratio and more negative magnetostriction in the free layer.

In exemplary embodiments of the invention, the overlayer is a protective, non-electrically conducting structure that defines a sharp non-diffuse interface with the free layer, promotes elastic scattering or spin-dependent reflection of sense current electrons with consequent maintenance of GMR effect, and minimizes sense current shunting away from the ferromagnetic (and spacer) layers. The overlayer preferably comprises a metal oxide, such as a material selected from the group consisting of aluminum oxide, tantalum oxide or other transition metal oxides such as zirconium oxide, titanium oxide, hafnium oxide, etc., and magnesium oxide. The overlayer can be formed by any suitable physical vapor deposition process, such as ion beam deposition or magnetron sputtering, with oxidation of the metal component of the overlayer being performed according to design preferences. The free layer magnetic thickness may range from approximately 35–26 Å or below. The desired magnetic thickness is preferably achieved while maintaining the sensor's GMR ratio in a range of approximately 13–15% and the free layer's magnetostriction in a range of approximately zero to $-2 \times 10^{-6}$.

The invention further contemplates methods for fabricating GMR sensors with an engineered overlayer formed on the free layer, as well as magnetic heads and disk drives incorporating such sensors.

BRIEF DESCRIPTION OF THE DRAWING

The foregoing and other features and advantages of the invention will be apparent from the following more particular description of preferred embodiments of the invention, as illustrated in the accompanying Drawing, in which.

DETAILED DESCRIPTION OF PREFERRED EMBODIMENTS

Figure 1:
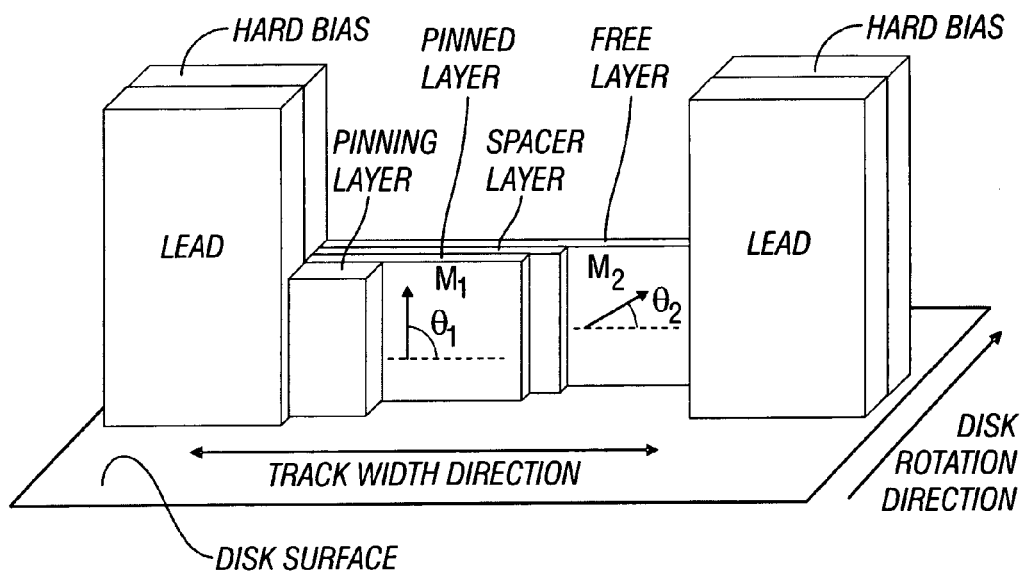
FIG. 1 is a perspective view showing a conventional GMR spin valve sensor.
Figure 2:
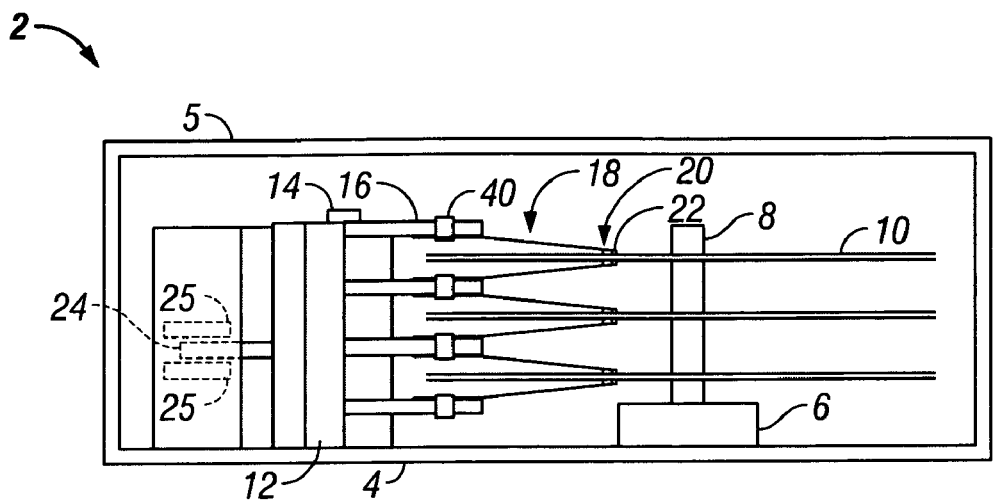
FIG. 2 is a side elevational view showing the interior of a disk drive incorporating a GMR spin valve sensor constructed in accordance with the present invention.
Figure 3:
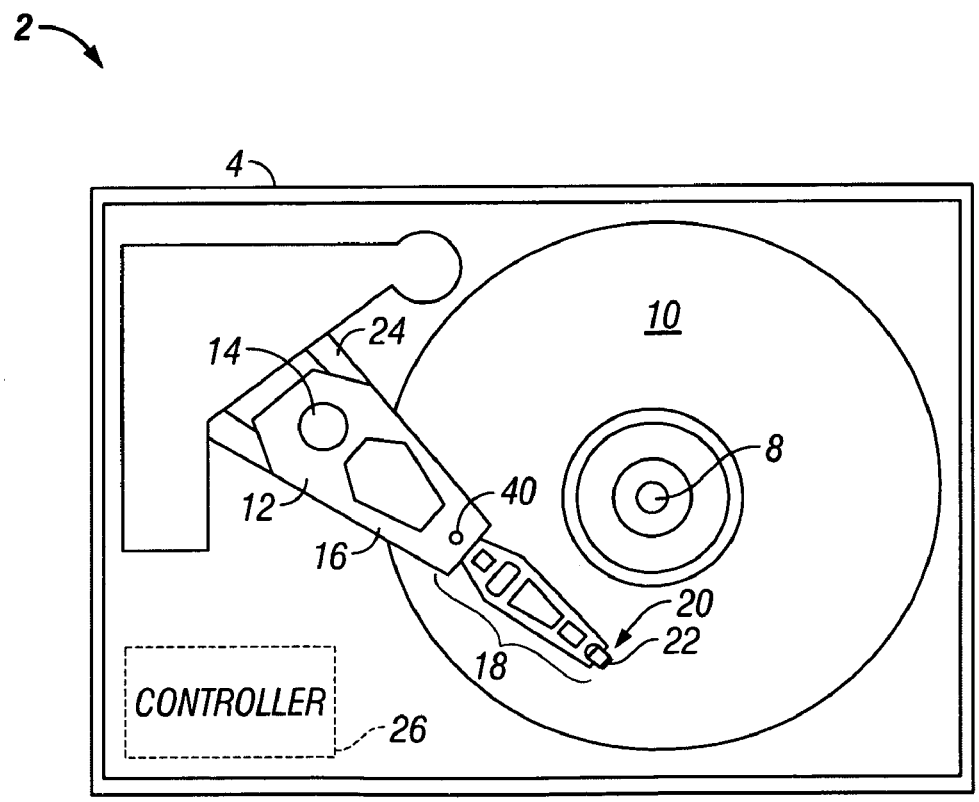
FIG. 3 is a plan view of the disk drive of FIG. 2.

Turning now to the figures (which are not necessarily to scale), wherein like reference numerals represent like elements in all of the several views, FIGS. 2 and 3 illustrate an exemplary disk drive 2 that incorporates a GMR spin valve sensor having an engineered overlayer in accordance with the invention. Note that the disk drive 2 is shown in greatly simplified schematic form, with only those construction details that are necessary for an understanding of the invention being represented. As to these illustrated components, it should be understood that all are conventional in nature unless otherwise indicated below.

The disk drive 2 conventionally includes a base casting 4 made from aluminum or other suitable material. A cover 5 is removably mounted thereto via a hermetic seal (not shown). The base casting 4 supports a conventional spindle drive motor 6 having an associated drive spindle 8. The drive spindle 8 carries a set of disks 10 for high speed rotation therewith. The disks 10 form a spaced vertically stacked disk platter arrangement. Each disk 10 is conventionally formed from an aluminum or glass substrate with appropriate coatings being applied thereto such that at least one, and preferably both, of the upper and lower surfaces of the disks are magnetically encodable and aerodynamically configured for high speed interaction with a read/write transducer (described below).

Data access to the disk surfaces is achieved with the aid of an actuator 12 that is mounted for rotation about a stationary pivot shaft 14. The actuator 12 includes a set of rigid actuator arms 16 that respectively carry either one or two flexible suspensions 18 (see FIG. 2). Each suspension 18 supports a slider 20 and a transducer 22 that are positioned to interact with an associated disk surface, representing the transducer's recording medium. The sliders 20 are aerodynamically designed so that when the disks 10 are rotated at operational speed, an air bearing develops between each slider and its associated disk surface. The air bearing is very thin (typically 0.05 $\mu$m) so that the transducers 22 are positioned in close proximity to the recording media. A conventional voice coil motor 24 is provided for pivoting the actuator 12. This motion sweeps the actuator arms 16 and their slider-carrying suspensions 18 generally radially across the respective surfaces of the disks 10, allowing the transducers 22 to be positioned from one concentric data track to another during seek, settle and track following operations of the drive 2.

As described in more detail below, each transducer 22 is an integrated device that includes a magnetic write head and a GMR spin valve sensor read head constructed in accordance with the invention. Data is read from the disks 10 by the read head portion of each transducer 22. This data is processed into readback signals by signal amplification and processing circuitry (not shown) that is conventionally located on each actuator arm 16. The readback signals carry either customer data or transducer position control information depending on whether the active read head is reading from a customer data region or a servo region on one of the disks 10. The readback signals are sent to the drive controller 25 for conventional processing. Data is recorded on the disks 10 by the write head portion of each transducer 22. This data is provided by write data signals that are generated by the controller 25 during data write operations. The write data signals are delivered to whichever write head is actively writing data. The active write head then records the positive and negative magnetic domains representing digital information to be stored onto the recording medium.

Figure 4:
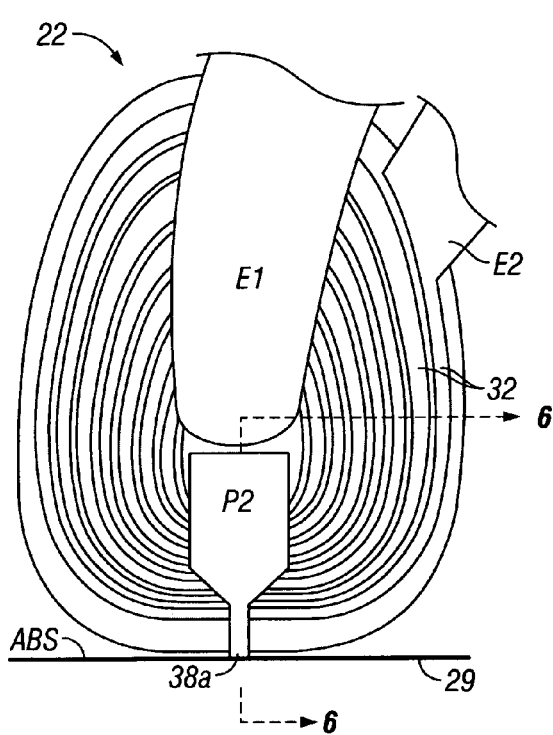
FIG. 4 is a plan view of an integrated read/write transducer for use in the disk drive of FIG. 2.
Figure 5:
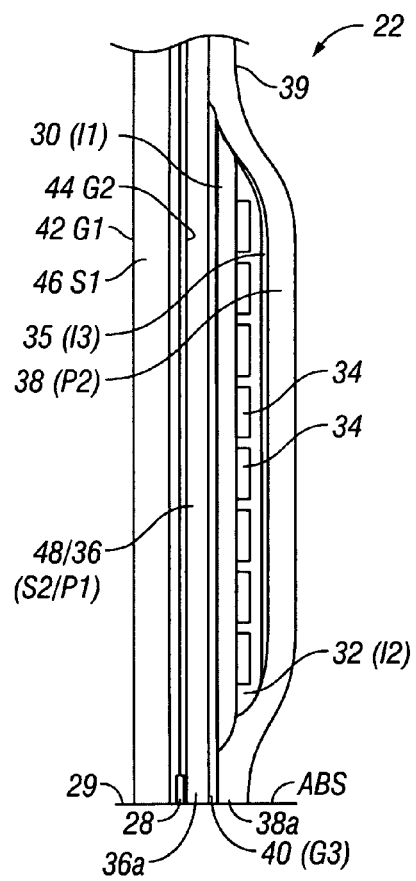
FIG. 5 is a side elevational view of the transducer of FIG. 4.
Figure 6:
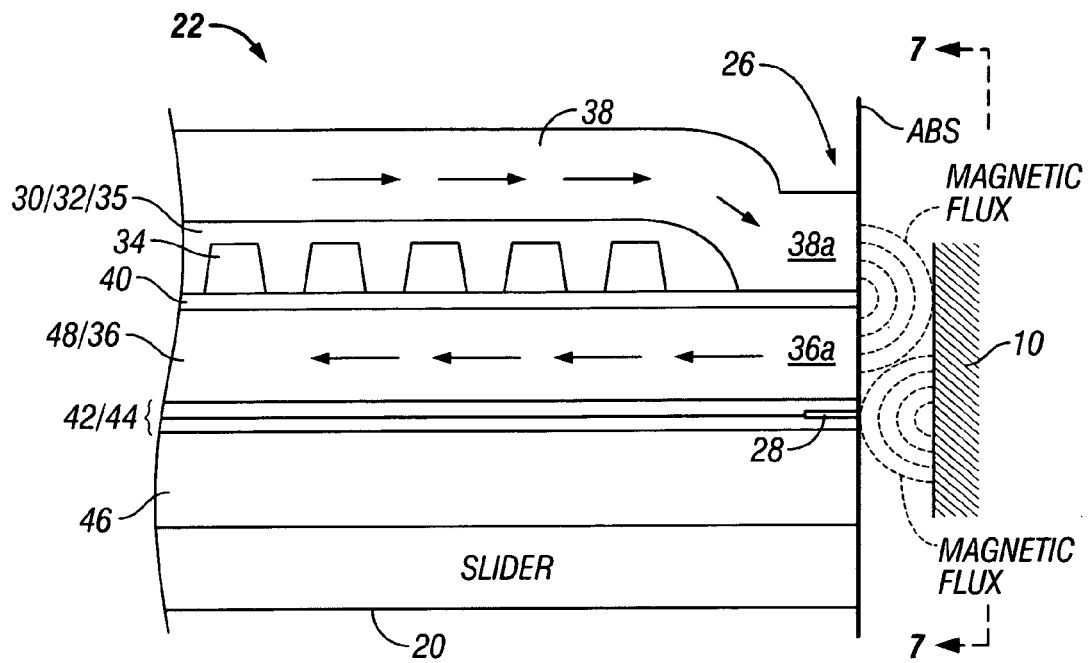
FIG. 6 is a cross-sectional view taken along line 6—6 in FIG. 4.
Figure 7:
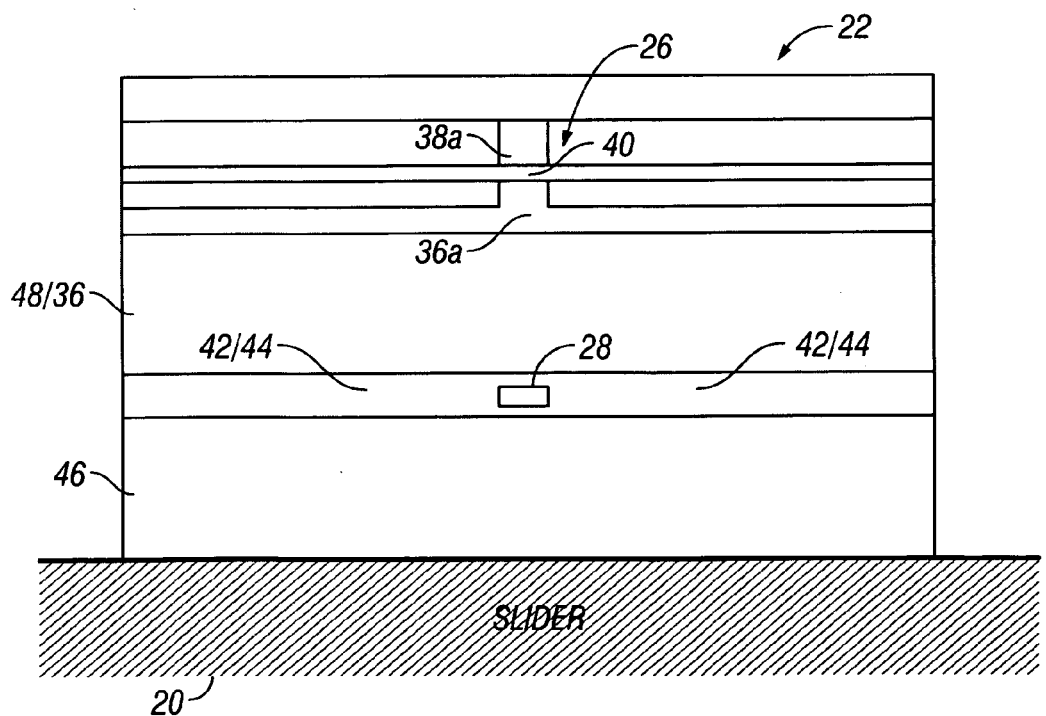
FIG. 7 is an ABS view of the transducer of FIG. 3 taken in the direction of arrows 7—7 in FIG. 6.

Turning now to FIGS. 4–7, an exemplary one of the transducers 22 is shown as including a transducer write head portion 26 and a transducer read head portion 28. In FIGS. 4–6, the transducer 22 is shown as being lapped at 29 to form an air bearing surface (ABS) where the transducer magnetically interacts with the adjacent rotating disk surface. The ABS 29 is spaced from the disk surface during drive operations by virtue of the above-described air bearing. FIG. 7 depicts the transducer 22 from the vantage point of the disk surface, looking toward the ABS 29.

The write head 26 conventionally includes a first insulative layer 30 (commonly referred to as "I1") supporting a second insulative layer 32 (commonly referred to as "I2") that carries plural inductive coil loops 34. A third insulative layer 35 (commonly referred to as "I3") can be formed above the coil loops 34 for planarizing the write head 26 to eliminate ripples in the I2 insulative layer 32 caused by the coil loops. The coil loops 34 inductively drive first and second pole pieces 36 and 38 that form the yoke portion of the write head 26. The pole pieces 36 and 38 respectively extend from a back gap 39 to pole tips 36a and 38a located at the ABS 29. An insulative gap layer 40 (commonly referred to as "G3") is sandwiched between the pole pieces 36 and 38 to provide a magnetic write gap at the pole tips 36a and 38a. Note that the pole piece 36 is commonly referred to as a "P1" pole piece. The pole piece 38 may be referred to as a "P2" or "P3" pole piece depending on how the pole tip 38a is formed. It is labeled as "P2" in FIG. 5. During data write operations, electrical current passing through a pair of electrical leads E1 and E2 to the coil loops 34 generates a magnetic field that induces a magnetic flux in the P1 and P2 layers 36 and 38. As shown in FIG. 6, this magnetic flux propagates from the yoke to the pole tips 36a and 38a, where it fringes across the gap layer 40 at the ABS 29. This causes magnetic domains to be formed on an adjacent recording surface of one of the disks 10. The orientation of each recorded magnetic domain is dependent on the magnetization direction of the pole tips 36a and 38a, which in turn is determined by the direction of the electrical current passing through the coil loops 34. Reversing the coil's electrical current reverses the magnetization direction of the pole tips 36a and 38a, and consequently reverses the orientation of the next recorded magnetic domain. This magnetization reversal process is used to encode data on the recording medium.

The read head 28 lies between insulative gap layers 42 and 44 at the ABS 29, where it is influenced by magnetic flux emanating from the adjacent disk surface. The gap layers 42 and 44 are commonly referred to as "G1" and "G2" gap areas, and are sandwiched between a first magnetic shield layer 46 (commonly referred to as an "S1" shield) and second magnetic shield layer 48 (commonly referred to as an "S2" shield). In some designs, including that of FIG. 5, the S2 shield layer 48 also provides the P1 pole piece 36. The P1 shield layer 46 is conventionally formed over the slider 20, which is only partially shown in FIGS. 5 and 6 for clarity.

Figure 8:
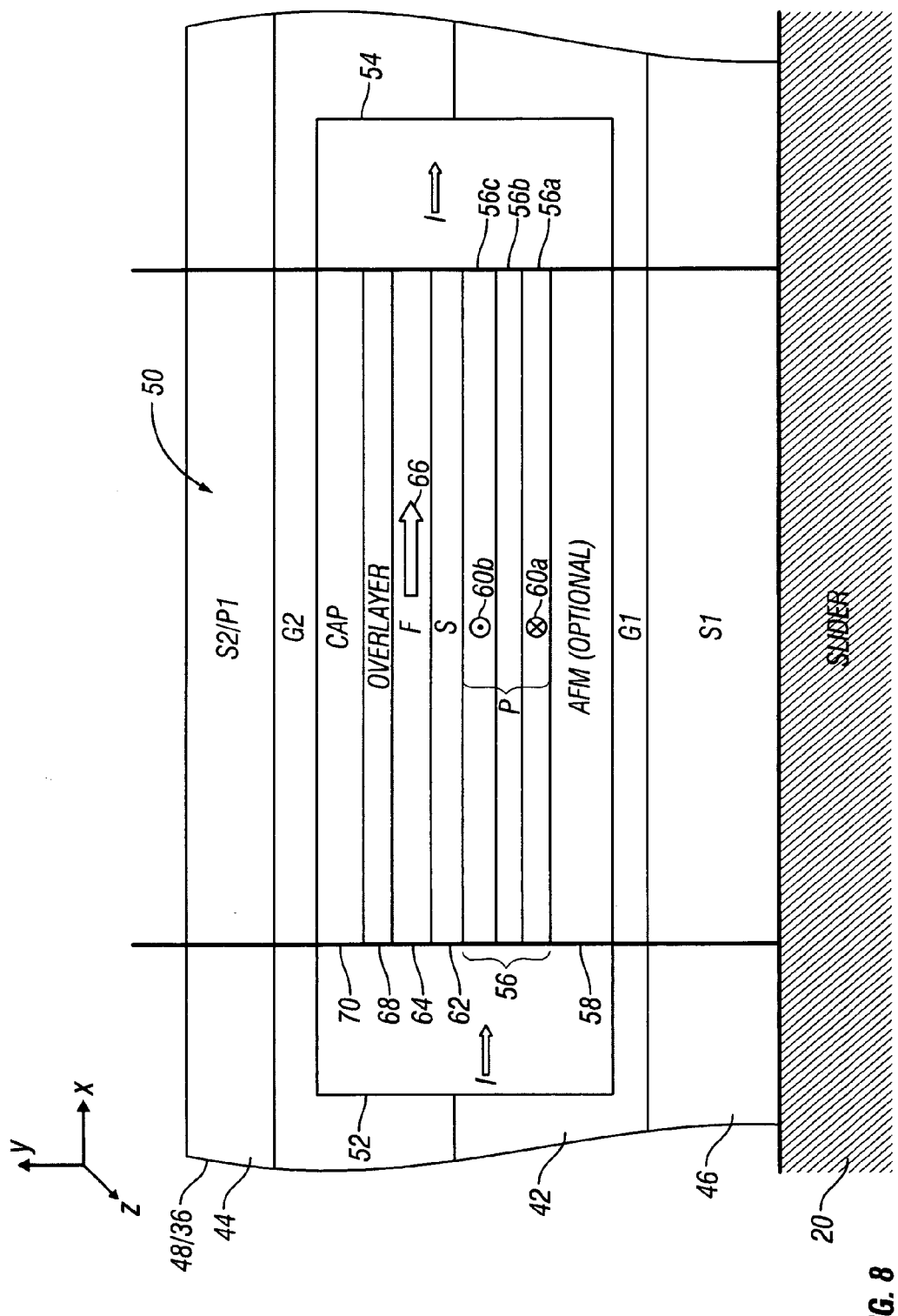
FIG. 8 is a detailed ABS view of an exemplary embodiment of a GMR spin valve sensor constructed in accordance with the invention.

Turning now to FIG. 8, the read head 28 is shown to comprise a GMR spin valve sensor 50 that is constructed in accordance with a preferred embodiment of the invention. As in the case of FIG. 7, the view of FIG. 8 is taken on a plane that is parallel to the ABS 29. The "x" axis in FIG. 8 represents the radial track width direction of a concentric track on the adjacent disk surface. The "y" axis in FIG. 8 represents the circumferential centerline direction of a concentric track on the disk. The "z" axis represents the direction pointing perpendicularly into the disk surface.

It will be seen in FIG. 8 that the sensor 50 has multiple materials layers that are sandwiched between the S1 and G1 layers 46 and 42 on one side, and the S2 and G2 layers 48 and 44 on the other side. A pair of electrical lead structures 52 and 54 are situated to deliver a sense current "I" to the sensor 50 according to a CIP orientation.

The sensor 50 is implemented as a "bottom-type" spin valve sensor. It thus begins with a ferromagnetic pinned (P) layer 56 whose magnetization direction is fixed perpendicular to the plane of FIG. 8. Although the pinned layer 56 could be self pinned, for example, by forming it with very high positive magnetostriction and very large compressive stress (according to existing techniques), FIG. 8 shows an implementation wherein the pinned layer 56 is externally pinned by an optional antiferromagnetic (AFM) pinning layer 58. The pinning layer 58 is deposited to a suitable thickness on one or more conventional seed layers that are formed on top of the G1 gap layer 42. The pinning layer 58 can be made from platinum-manganese (Pt—Mn), nickel-manganese (Ni—Mn), iridium-manganese (Ir—Mn), or any other suitable antiferromagnetic material that is capable of exchange biasing the ferromagnetic material in the pinned layer 56.

The pinned layer 56 can be implemented in conventional fashion as a single layer ideally having one magnetization direction, or as plural sub-layers ideally having parallel and anti-parallel magnetization directions. FIG. 8 shows an example of the latter configuration, with the pinned layer 56 being formed by growing a first sublayer 56a of cobalt-iron (CoFe), a second sublayer 56b of ruthenium (Ru), and a third sublayer 56c of cobalt-iron (CoFe). These sublayers are formed on top of the pinning layer 58 at suitable thicknesses. The magnetic moment of the first sublayer 56a is shown by the arrow tail 60a, which points into the plane of FIG. 8. The magnetic moment of the third sublayer 56c is shown by the arrowhead 60b, which points out of the plane of FIG. 8. The magnetic moments 60a and 60b are thus antiparallel to each other and oriented generally perpendicular to the sensing surface (ABS) of the sensor 50.

As stated, the pinned layer 56 will have its magnetic moment fixed by interfacial exchange coupling with the pinning layer 58. The magnetization direction(s) of the pinned layer 56 will be sufficiently fixed by the exchange-biasing pinning layer 58 to prevent rotation thereof in the presence of relatively small external magnetic fields, such as the fields produced by magnetic domains recorded on the adjacent disk surface.

A spacer layer 62 is formed on top of the pinned layer 56 as a suitably thick deposit of an electrically conductive, non-ferromagnetic material, such as Cu.

The sensor's free layer 64 is formed above the spacer layer 62. The free layer 64 can be made by covering the spacer layer 62 with a single layer of Co, Co—Fe, Ni—Fe or other suitable ferromagnetic material grown to a suitable thickness. In an alternative configuration, the free layer 64 can be formed from multiple layers, such as a bilayer structure comprising a bottom sublayer of Co—Fe and a top sublayer of Ni—Fe, or a trilayer structure comprising a bottom sublayer of Co—Fe, a middle sublayer of Ni—Fe and a top sublayer of Co—Fe.

The arrow 66 in FIG. 8 shows the preferred zero bias point magnetization direction of the free layer 64 when the sensor 50 is in a quiescent state with no magnetic field incursions from the adjacent disk surface. The magnetization direction 66 is preferably stabilized in suitable fashion, as by incorporating hard biasing regions (not shown) in the lead structures 52 and 54 so as to form a contiguous junction with the sides of the free layer 62. The hard biasing regions can be conventionally formed of ferromagnetic material with relatively high magnetic coercivity ($H_c$), such as cobalt-chromium-platinum (CoCrPt) and alloys thereof.

An engineered, protective, electrically non-conducting overlayer 68 is formed on the surface of the free layer 64 in order to reduce free layer magnetic thickness while preserving high GMR ratio and negative free layer magnetostriction. The overlayer 68 is preferably a metal oxide layer comprising aluminum oxide, tantalum oxide or other transition metal oxides such as titanium oxide, zirconium oxide, hafnium oxide, etc., or other material such as magnesium oxide. The thickness of the overlayer 68 may range from approximately 10–80 Å. As so constructed, the overlayer 68 is thermally stable and will form a sharp non-diffuse interface with the free layer 64 that promotes elastic scattering or spin-dependent reflection of sense current electrons with consequent maintenance of GMR effect and with minimal shunting of sense current away from the ferromagnetic (and spacer) layers of the sensor.

Figure 9:
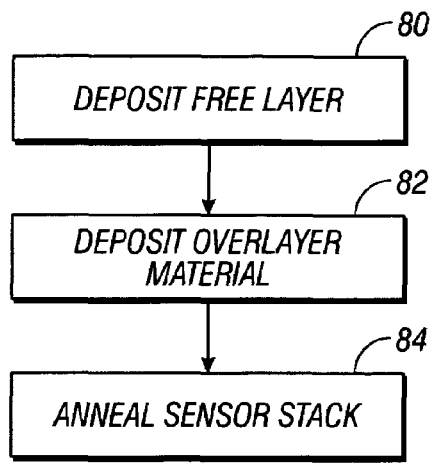
FIG. 9 is a flow diagram showing an exemplary method for fabricating GMR spin valve sensors in accordance with the invention.

The overlayer 68 can be formed using a suitable physical vapor deposition technique, such as ion beam deposition or magnetron sputtering. FIG. 9 illustrates an exemplary method for forming the overlayer 68. According to this method, the free layer 64 is formed in a process step 80 using conventional techniques. In step 82, the overlayer 68 is deposited on top of the free layer 64 using the desired physical vapor deposition technique. By way of example, ion beam deposition may be used with xenon (Xe) atoms to bombard at low pressure (e.g., 0.1 mTorr) a metal target comprising the desired metal of the overlayer 68. The foregoing operation will be performed in the presence of a suitable oxidizing mixture introduced at a suitable mass flow rate to oxidize the metal target. An exemplary oxidizing mixture is 80% argon/20% oxygen. An exemplary mass flow rate of this oxidizing mixture is 12–22 sccm (standard cubic centimeters per minute). The foregoing oxidation parameters have been found to minimize damage to the free layer 64 as a result of excessive oxidation while maintaining sufficient oxidation to produce an effective overlayer material.

Step 82 may also be performed using magnetron sputtering. In that case, a metal target comprising the desired metal of the overlayer 68 can be bombarded with argon (Ar) ions in the presence of a magnetic field at relatively low pressure (e.g., <1–5 mTorr). This operation will be performed in the presence of a suitable oxidizing mixture (e.g., 80% argon/20% oxygen) introduced at a suitable mass flow rate to oxidize the metal layer.

In step 84, the entire sensor stack structure is conventionally annealed to orient the exchange coupling between the AFM layer 58 and the pinned layer 56. Advantageously, it is believed that this annealing process may result in a reduction reaction in the free layer 64 that drives excess oxygen (caused by inadvertent oxidation thereof) into the overlayer 68, thereby tending to purify the free layer material. This may improve the quality of the interface between the metallic free layer 64 and the insulative overlayer 68 relative to the spin dependent reflection of sense current electrons.

Figure 10:
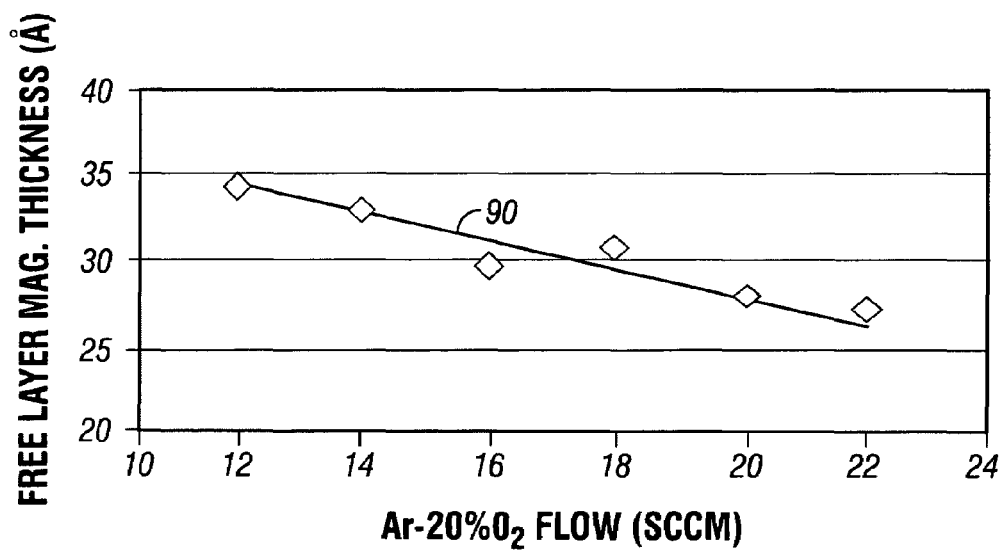
FIG. 10 is a graph showing free layer magnetic thickness as a function of oxidation used during overlayer formation.
Figure 11:
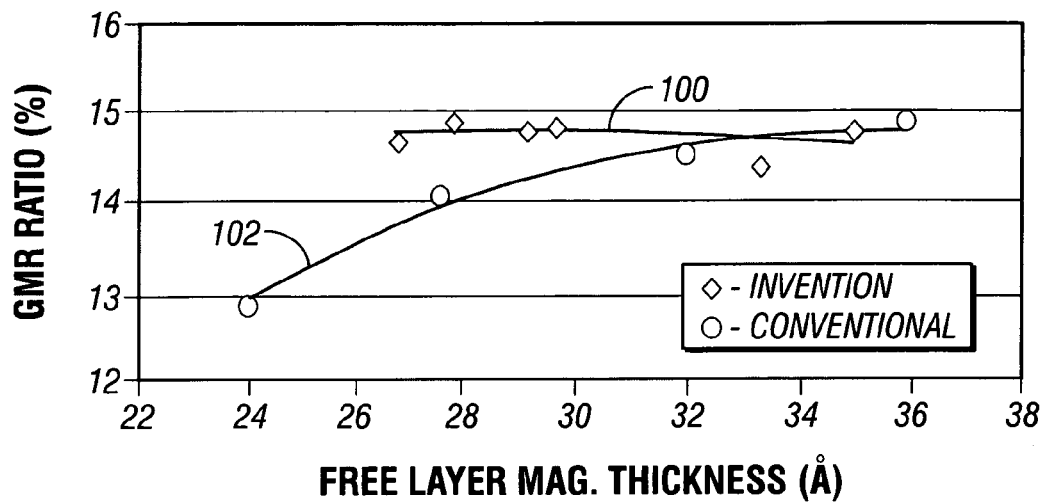
FIG. 11 is a graph showing GMR ratio as a function of free layer magnetic thickness.
Figure 12:
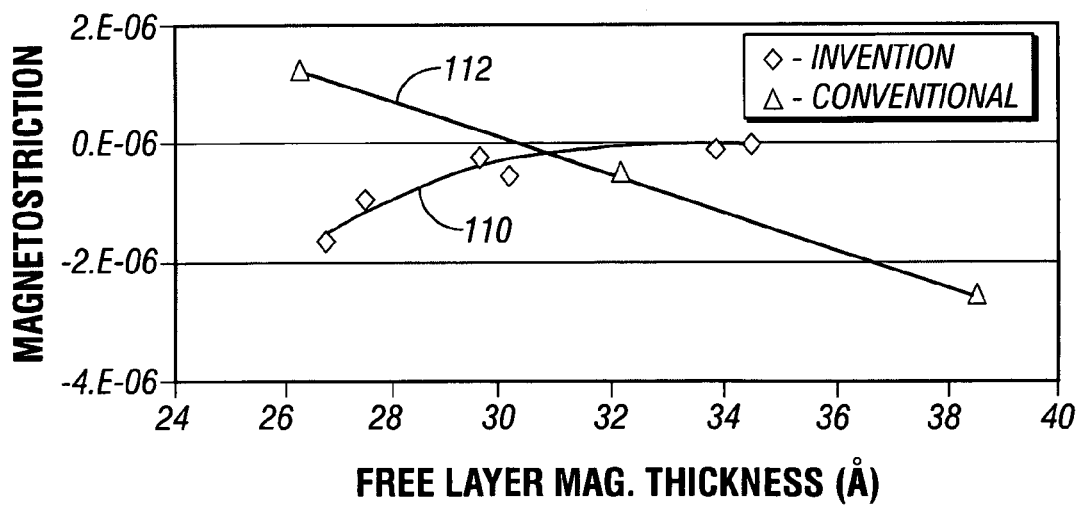
FIG. 12 is a graph showing magnetostriction as a function of free layer magnetic thickness.

Future spin valve sensors will require free layer magnetic thicknesses of 25 Å or below. Advantageously, the overlayer 68 permits controlled reduction of free layer magnetic thickness to these levels without reducing free layer physical thickness, thus allowing the sensor 50 to preserve high GMR ratio and achieve controlled negative free layer magnetostriction. These benefits are illustrated in FIGS. 10, 11 and 12, which show test results for two groups of sensors. A first group of sensors was built according the invention, with the overlayer 68 being formed from tantalum oxide deposited using ion beam deposition per the above. The free layer magnetic thickness of each sample was varied by changing the oxidation level of the overlayer 68 without altering the sample's free layer physical thickness. A second group of GMR sensors had tantalum capped free layers. The free layer magnetic thickness of each sample was varied by altering the sample's free layer physical thickness.

In FIG. 10, free layer magnetic thickness in angstroms is plotted for sensors in the first test group, with each sensor differing by the amount of sccm flow used during overlayer formation based on an oxidation mixture comprising 80% argon/20% oxygen. The material used for the free layer of each sensor was CoFe and was deposited to a thickness of 30 Å. The overlayer material (tantalum oxide) was deposited to a thickness of 60 Å.

As shown by the curve 90 in FIG. 10, as the oxidation mixture (80% argon/20% oxygen) flow rate was varied from approximately 12 to 22 sccm, the free layer magnetic thickness was reduced from approximately 35 to 27 Å, in substantially linear fashion, without varying the free layer physical thickness. By extrapolation, it will be seen that magnetic thicknesses of 25 Å or less could be achieved by using an 80% argon/20% oxygen flow rate of 24 sccm or greater.

As further shown in FIG. 11, the GMR ratio of the sensors in the first test group did not decrease as free layer magnetic thickness was reduced. Instead, as shown by the curve 100 in FIG. 11, as the free layer magnetic thickness decreased from approximately 35–26 Å, the sensor GMR ratio stayed relatively flat within a range of approximately 14.5–15 Å. By extrapolation, it will be seen that free layer magnetic thicknesses of 25 Å or less could also be achieved without significantly lowering GMR ratio or sensor sensitivity. This is contrary to the decrease in GMR ratio observed in sensors of the second test group in which reduction of free layer magnetic thickness was achieved by reducing free layer physical thickness. The curve 102 in FIG. 11 shows this conventional relationship.

FIG. 12 shows that a more desirable negative magnetostriction was achieved for sensors in the first test group than for sensors in the second test group throughout the desired free layer thickness range. In particular, the curve 110 in FIG. 12 shows that as free layer magnetic thickness was decreased from approximately 34–27 Å, the free layer magnetostriction of sensors in the first test group actually decreased from slightly negative to approximately $-2 \times 10^{-6}$. By extrapolation, it will be seen that free layer magnetostriction would become even more negative at free layer magnetic thicknesses of 25 Å or below. This is contrary to the undesirable increase in magnetostriction observed in sensors from the second test group with conventionally reduced free layer physical thickness, as shown by the curve 112 in FIG. 12.

Accordingly, a GMR spin valve sensor, a read head and a disk drive, together with methods for sensor fabrication, have been disclosed. Advantageously, the combination of reduced free layer magnetic thickness, high GMR ratio and negative magnetostriction allows the fabrication of high-performance spin valve sensors with full benefit from the high excitation offered by sensor free layers that are magnetically as thin as 25 Å or below. While various embodiments of the invention have been described, it should be apparent that many variations and alternative embodiments could be implemented in accordance with the invention. It is understood, therefore, that the invention is not to be in any way limited except in accordance with the spirit of the appended claims and their equivalents.

What is claimed is:

1. A method of making a GMR sensor with reduced free layer magnetic thickness without reduced free layer physical thickness comprising:

forming a ferromagnetic pinned layer having a substantially fixed magnetic moment;

forming an electrically conductive spacer layer above said ferromagnetic pinned layer;

forming a ferromagnetic free layer above said electrically conductive spacer layer such that said free layer has a physical thickness (t) and a magnetic thickness (Mr*t) representing the product of a remanent magnetic moment density (Mr) of said free layer and said free layer physical thickness (t); and reducing said free layer magnetic thickness by fanning a protective electrically non-conducting overlayer on said free layer using a deposition process in which said overlayer is deposited directly on said free layer in the presence of an oxidizing atmosphere that is controlled, to reduce said free layer magnetic thickness to a desired level without reducing said free layer physical thickness.

2. A method in accordance with claim 1 wherein said overlayer comprises a metal oxide material.

3. A method in accordance with claim 1 wherein said overlayer comprises a material selected from the group consisting of aluminum oxide, tantalum oxide, titanium oxide, zirconium oxide, hafnium oxide and magnesium oxide.

4. A method in accordance with claim 1 wherein formation of said overlayer comprises:
   deposition of said free layer;
   deposition of said overlayer, and
   annealing said sensor.

5. A method in accordance with claim 4 wherein deposition of said overlayer comprises depositing metal oxide material by physical vapor deposition in the presence of an oxidation gas mixture.

6. A method in accordance with claim 1 wherein deposition of said overlayer comprises depositing metal oxide material by ion beam deposition or magnetron sputtering in the presence of an argon oxygen oxidation gas mixture.

7. A method in accordance with claim 1 wherein deposition of said overlayer comprises depositing metal oxide material by ion beam deposition using xenon atoms with oxidation being provided by an Ar-20%$O_2$ gas mixture delivered at a flow rate of approximately 12–22 sccm.

8. A method in accordance with claim 1 wherein said free layer magnetic thickness is in a range of approximately 26–35 Å.

9. A method in accordance with claim 1 wherein said sensor has a GMR ratio in a range of approximately 3–15 percent.

10. A method in accordance with claim 1 wherein said free layer has negative magnetostriction in a range of approximately $-2\times10^{-6}$ to less than zero.

* * * * *

UNITED STATES PATENT AND TRADEMARK OFFICE
CERTIFICATE OF CORRECTION

PATENT NO. : 7,007,373 B2
DATED : March 7, 2006
INVENTOR(S) : Witold Kula et al.

Page 1 of 1

It is certified that error appears in the above-identified patent and that said Letters Patent is hereby corrected as shown below:

Column 8,
Line 63, change "fanning" to -- forming --.

Signed and Sealed this

Twenty-third Day of May, 2006

JON W. DUDAS
*Director of the United States Patent and Trademark Office*